United States Patent
Purdy (10) Patent No.: US 7,026,170 B1
(45) Date of Patent: Apr. 11, 2006

(54) METHODS OF CONTROLLING OPTICAL PROPERTIES OF A CAPPING INSULATING LAYER ON MEMORY DEVICES, AND SYSTEM FOR PERFORMING SAME

(75) Inventor: Matthew A. Purdy, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 126 days.

(21) Appl. No.: 10/458,881

(22) Filed: Jun. 11, 2003

(51) Int. Cl.
*H01L 21/00* (2006.01)

(52) U.S. Cl. ............................................. 438/7
(58) Field of Classification Search .................. 438/5, 438/7, 16; 700/121
See application file for complete search history.

(56) References Cited

U.S. PATENT DOCUMENTS

| | | | |
|---|---|---|---|
| 5,955,139 A * | 9/1999 | Iturralde | 427/9 |
| 6,128,232 A | 10/2000 | Keller et al. | 365/185.29 |
| 6,153,504 A | 11/2000 | Shields et al. | 438/613 |
| 6,177,040 B1 | 1/2001 | Dennis | 264/272.13 |
| 6,274,900 B1 | 8/2001 | San et al. | 257/314 |
| 6,380,067 B1 | 4/2002 | Subramanian et al. | 438/624 |
| 6,383,870 B1 | 5/2002 | San et al. | 438/257 |
| 6,455,372 B1 | 9/2002 | Weimer | 438/257 |
| 6,456,536 B1 | 9/2002 | Sobek et al. | 365/185.28 |
| 6,479,346 B1 | 11/2002 | Yi et al. | 438/257 |
| 6,479,348 B1 | 11/2002 | Kamal et al. | 438/258 |
| 6,587,744 B1 * | 7/2003 | Stoddard et al. | 700/121 |
| 6,828,595 B1 * | 12/2004 | Leng | 257/98 |

* cited by examiner

*Primary Examiner*—Matthew Smith
*Assistant Examiner*—Lex H. Malsawma
(74) *Attorney, Agent, or Firm*—Williams, Morgan & Amerson, P.C.

(57) ABSTRACT

The present invention is generally directed to various methods of controlling optical properties of a capping insulating layer on memory devices, and system for performing same. The method includes forming a first capping layer that includes at least one process layer above a memory cell formed above a first semiconducting substrate, measuring at least one optical characteristic of the first capping layer and determining at least one parameter of a deposition process to form a second capping layer that includes at least one process layer above a memory cell formed above a second semiconducting substrate based upon the measured optical characteristic of the first capping layer. In another case, the method includes performing a deposition process in a deposition tool to form a capping layer that includes at least one process layer above a memory cell on a first substrate, measuring at least one optical characteristic of the capping layer formed above the first substrate, adjusting at least one parameter of the deposition process based upon the measured optical characteristic of the capping layer formed above the first substrate, and performing the deposition process that includes the adjusted parameter in the deposition tool to form a capping layer that includes at least one process layer above a memory cell on a second substrate.

77 Claims, 3 Drawing Sheets

METHODS OF CONTROLLING OPTICAL PROPERTIES OF A CAPPING INSULATING LAYER ON MEMORY DEVICES, AND SYSTEM FOR PERFORMING SAME

BACKGROUND OF THE INVENTION

1. Field of the Invention

This invention relates generally to semiconductor fabrication technology, and, more particularly, to various methods of controlling optical properties of a capping insulating layer on memory devices, and system for performing same.

2. Description of the Related Art

Memory devices such as erasable programmable read-only memories (EPROMs), electrically erasable programmable read-only memories (EEPROMs), or flash erasable programmable read-only memories (FEPROMs) are, as their name indicates, erasable. Such erasable memory cells are used in a variety of different devices, e.g., digital cellular phones, digital cameras, LAN switches, cards for notebook computers, etc. A memory cell operates by storing electric charge (representing a digital "0" or "1" state) to an electrically isolated floating gate, which is incorporated into a transistor. This stored charge affects the behavior of the transistor, thereby providing a way to "read" the memory element. The switching speed of such a memory cell for converting from one state to the other state is limited in part by the speed of charge dissipation from the floating gate (i.e., the erase speed). Because faster erase speeds equate to faster switching speeds, efforts have been made to increase the erase speeds of such memory devices, as well as to improve the erase uniformity among the memory cells.

A flash memory cell typically consists of a transistor, a floating gate, and a control gate above the floating gate in a stacked gate structure. The floating gate, typically comprised of polycrystalline silicon (i.e., "polysilicon"), is electrically isolated from the underlying semiconductor substrate by a thin dielectric layer, which is typically formed of silicon oxide. Because charge is transferred across the dielectric layer by quantum-mechanical tunneling, this dielectric layer is often referred to as a "tunnel oxide" layer. Such tunnel oxide layers are typically approximately 100 Å thick. Properties of the tunnel oxide must be strictly controlled to ensure the ability to read and write by tunneling, while avoiding data loss through charge trapping or leakage. The control gate is positioned above the floating gate, and is electrically isolated from the floating gate by a storage dielectric layer, such as an oxide-nitride-oxide (ONO) stack.

Storing charge on the floating gate programs a memory cell. This is achieved via hot-electron injection by applying a high positive voltage (approximately 12V) to the control gate, and a high drain-to-source bias voltage (approximately 6V). An inversion region is created between the source and drain by the control gate voltage, and electrons are accelerated from the source to the drain by the drain bias voltage. Some fraction of these electrons will have sufficient energy to surmount the tunnel oxide barrier height and reach the floating gate. The floating gate is therefore programmed by collecting and storing these electrons to represent one digital state.

The negative charge captured in the floating gate makes the channel more positive and, thus, less conducting. As a result, the threshold voltage is higher for a charged cell than for an uncharged cell. Consequently, for a given voltage applied to the control gate, the non-volatile memory cell will conduct if the floating gate has no stored charge and will not conduct if the floating gate has stored charge. Therefore, a logical low or high is provided by the non-volatile memory cell based on whether or not the cell conducts at a given threshold voltage.

During the course of manufacturing integrated circuit products, such as memory products, microprocessors, ASICs, etc., various electrical charges may be stored on portions of the devices. For example, a charge may be inadvertently stored on the floating gate of a flash memory device. The undesirable charges may be the result of performing manufacturing processes that apply various voltages to the substrate and/or set up various electrical fields as part of the normal processing operations, e.g., processing tools that involve generating a plasma during the use of such tools.

To remove such undesirable charges from the product, the integrated circuit product is typically irradiated with ultraviolet (UV) light. This UV exposure process is typically performed to dissipate the undesirable charges prior to performing various electrical tests on the products to ensure that the products meet various electrical performance requirements. The ultraviolet light provides the stored electrons in the product with enough extra energy to dissipate through, for example, a word line of a memory product. However, this is a relatively time-consuming process. For example, after fabrication is completed, a wafer may be subjected to a UV erase process for a duration of approximately 8 minutes (two 4 minute cycles). Such UV erase processes are typically performed for a relatively long duration to accommodate a worst-case scenario as it relates to the magnitude of the stored charges and the optical characteristics and thicknesses of the capping layers. Such a process may lead to manufacturing inefficiencies and delay production. In some cases, excessive UV exposure may be detrimental to one or more operational aspects of the device.

The present invention is directed to various methods and systems that may solve, or at least reduce, some or all of the aforementioned problems.

SUMMARY OF THE INVENTION

The present invention is generally directed to various methods of controlling optical properties of a capping insulating layer on memory devices, and system for performing same. In one illustrative embodiment, the method comprises forming a first capping layer comprised of at least one process layer above a memory cell formed above a first semiconducting substrate, measuring at least one optical characteristic of at least one of the process layers that comprise the first capping layer and determining at least one parameter of a deposition process to form at least one process layer of a second capping layer comprised of at least one process layer above a memory cell formed above a second semiconducting substrate based upon the measured optical characteristic. In some cases, the first and second capping layers are each single layers of material. In other embodiments, the first and second capping layers are each comprised of a plurality of process layers.

In another illustrative embodiment, the method comprises performing a deposition process in a deposition tool to form a capping layer comprised of at least one process layer above a memory cell on a first substrate, measuring at least one optical characteristic of the at least one process layer that comprises the capping layer formed above the first substrate, adjusting at least one parameter of the deposition process based upon the measured at least one optical characteristic of the capping layer formed above the first substrate, and performing the deposition process comprised of the adjusted parameter in the deposition tool to form at least one process layer of a capping layer comprised of at least one process layer above a memory cell on a second substrate.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various structures and doped regions of the semiconductor device are depicted in the drawings as having very precise, sharp configurations and profiles, those skilled in the art recognize that, in reality, these regions and structures may not be as precise as indicated in the drawings. Additionally, the relative sizes of the various features and implant regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling optical properties of a capping insulating layer on memory devices, and system for performing same. As will be readily apparent to those skilled in the art upon a complete reading of the present application, the present invention may be employed in connection with the formation of a variety of different capping insulating layers on a variety of different types of integrated circuit products, such as memory devices, microprocessors, ASICs, integrated circuit devices having a floating gate, integrated circuit devices that comprise a memory cell and logic circuitry, etc. Thus, the present invention should not be considered as limited to the particular embodiments disclosed herein unless such limitations are clearly set forth in the appended claims. U.S. Pat. No. 6,380,067 B1 entitled "Method for Creating Partially UV Transparent Anti-Reflective Coating for Semiconductors," which is currently assigned to Advanced Micro Devices, Inc., the assignee of the present application, is hereby incorporated by reference in its entirety.

Figure 1:
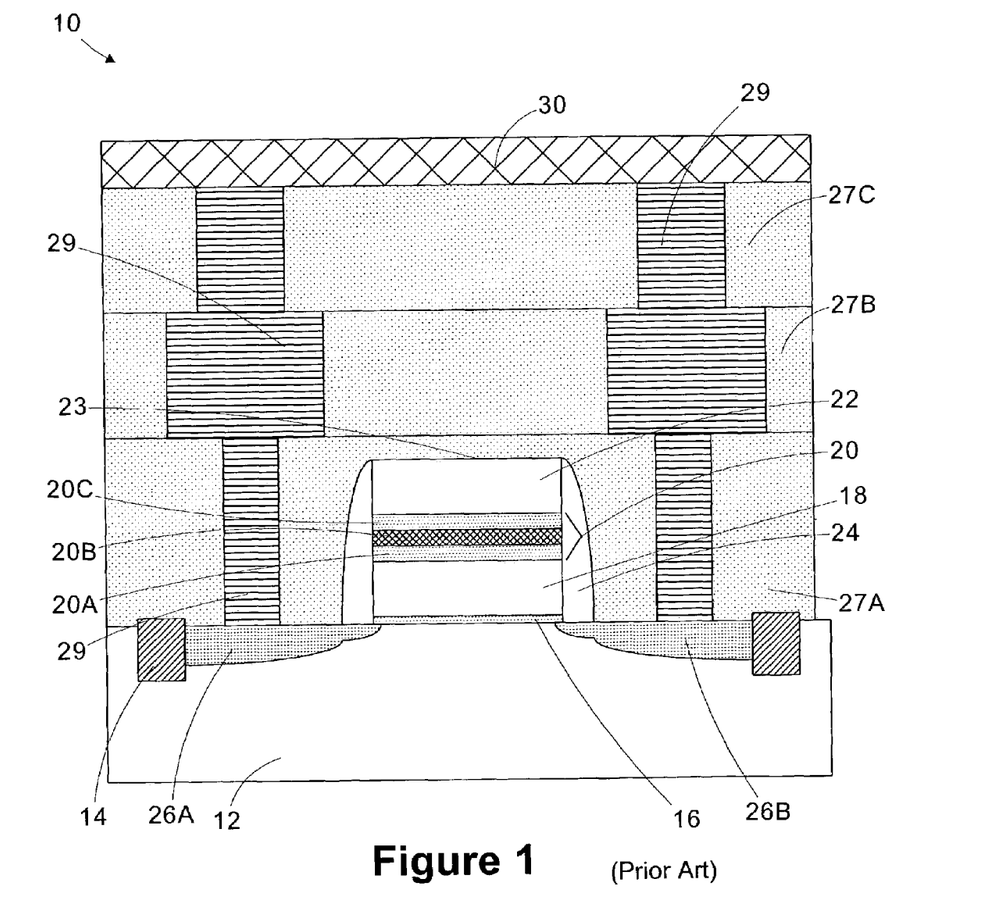
FIG. 1 is a cross-sectional view of a portion of an illustrative prior art memory cell.

FIG. 1 is a cross-sectional depiction of an illustrative memory cell 10 which may be employed in connection with one illustrative embodiment of the present invention. As shown therein, the memory cell 10 is formed above a semiconducting substrate 12 between shallow trench isolation regions 14 formed in the substrate 12. The memory cell 10 is generally comprised of a gate insulation layer 16, sometimes referred to as a "tunnel oxide," a floating gate 18, an inter-poly composite insulating layer 20 (typically comprised of a layer of oxide 20A, a layer of nitride 20B, and a layer of oxide 20C) (a so-called ONO stack), and a control gate 22. The memory cell 10 further comprises sidewall spacers 24, a source region 26A, a drain region 26B and a capping insulating layer 30.

Also depicted in FIG. 1 are a plurality of insulating layers 27A–C having a plurality of conductive interconnections 29, e.g., conductive lines and plugs, formed in the insulating layers 27A–C to provide electrical connection to various components of the memory cell 10. The number of insulating layers 27A–C and the configuration of the conductive interconnections 29 are provided by way of example only. Thus, the present invention should not be considered as limited to any particular configuration of the memory cell 10, the components thereof, or the number, location or pattern of the insulating layers 27A–C and the conductive interconnections 29, unless such limitations are expressly set forth in the appended claims. Additional structures may also be provided to complete the formation of the memory cell 10; however, such structures are not depicted in the drawings or discussed herein so as not to obscure the present invention.

The illustrative memory cell 10 depicted in FIG. 1 may be formed by a variety of known techniques, and the various components may be formed by a variety of known techniques. For example, the gate insulation layer 16 may be comprised of a thermally grown layer of silicon dioxide. The floating gate 18 and the control gate 22 may be comprised of polysilicon. The sidewall spacers 24 may be comprised of a variety of materials, e.g., silicon dioxide, silicon nitride, etc. It should be understood additional layers of material may be formed on a typical memory cell, although such layers are not depicted in FIG. 1. For example, a bottom anti-reflective coating layer (not shown) or another layer of material (not shown) may be formed above the top surface 23 of the control gate 22.

Figure 2:
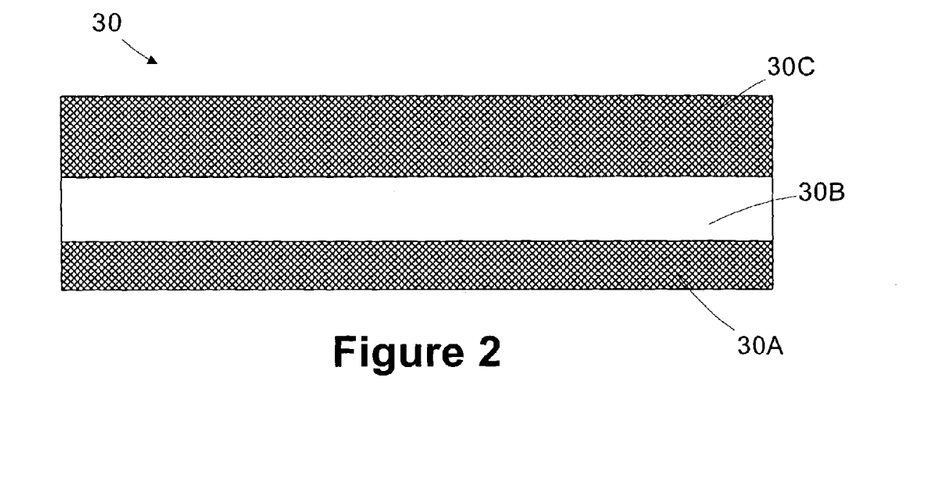
FIG. 2 is a cross-sectional view of a capping insulating layer that is comprised of a plurality of layers of material.

As depicted in FIG. 1, a capping layer 30 will ultimately be formed above the completed memory cell 10. The capping layer 30 may be a single layer of material or it may be a film stack comprised of a plurality of individual process layers. For example, FIG. 1 indicates the illustrative situation where the capping layer 30 is comprised of a single process layer, e.g., silicon nitride, having a thickness ranging from approximately 800–940 nm. FIG. 2 is an enlarged view of the capping layer 30 wherein it is comprised of a plurality of individual process layers 30A–C that make up a film stack. In one illustrative embodiment, the bottom process layer 30A is comprised of silicon nitride (thickness of approximately 240–260 nm with an index of refraction of approximately 1.8–2.0), the middle process layer 30B is comprised of spin-on glass (thickness of approximately 215–265 nm), and the top process layer 30C is comprised of silicon nitride (thickness of approximately 900–1100 nm with an index of refraction of approximately 2.1–2.2).

The capping layer 30 may be formed of a variety of materials, such as, for example, silicon nitride, silicon dioxide, spin-on-glass, etc., and its overall target thickness or the target thickness of individual process layer(s) that comprise the capping layer 30 may vary depending upon the particular application. The capping layer 30 may be formed by a variety of techniques, e.g., chemical vapor deposition ("CVD"), plasma enhanced chemical vapor deposition ("PECVD"), etc. Thus, the particular composition and thickness of the capping layer 30 or layers that comprise the capping layer 30, as well as the manner in which it is made, should not be considered a limitation of the present invention unless such limitations are expressly set forth in the appended claims.

As set forth in the background section of this application, in order to erase or dissipate undesired stored charges on the memory cell 10 due to various manufacturing activities, the memory cell 10 is irradiated with ultraviolet ("UV") light. The UV exposure process is typically performed prior to performing a variety of electrical tests on the completed product to insure its ability to meet various electrical performance requirements.

However, due to a variety of factors, which may be known or unknown, the optical characteristics of the capping layer 30 may vary. Such variations may occur between different lots (lot-to-lot variations) or between wafers within the same lot (within-lot variations). For example, the capping layer 30 may exhibit variations in optical parameters such as index of refraction ("n"), extinction coefficient ("k"), etc. Such variations may occur for a variety of reasons, i.e., faulty or dirty deposition equipment, variations in process gases used to form the capping layer 30, variations in the materials or structures underlying the capping layer 30, human error, etc. As a result of such variations, the erase time for a given memory cell 10 may be longer than anticipated due to the degradation of one or more optical properties or characteristics of the capping layer 30.

Figure 3:
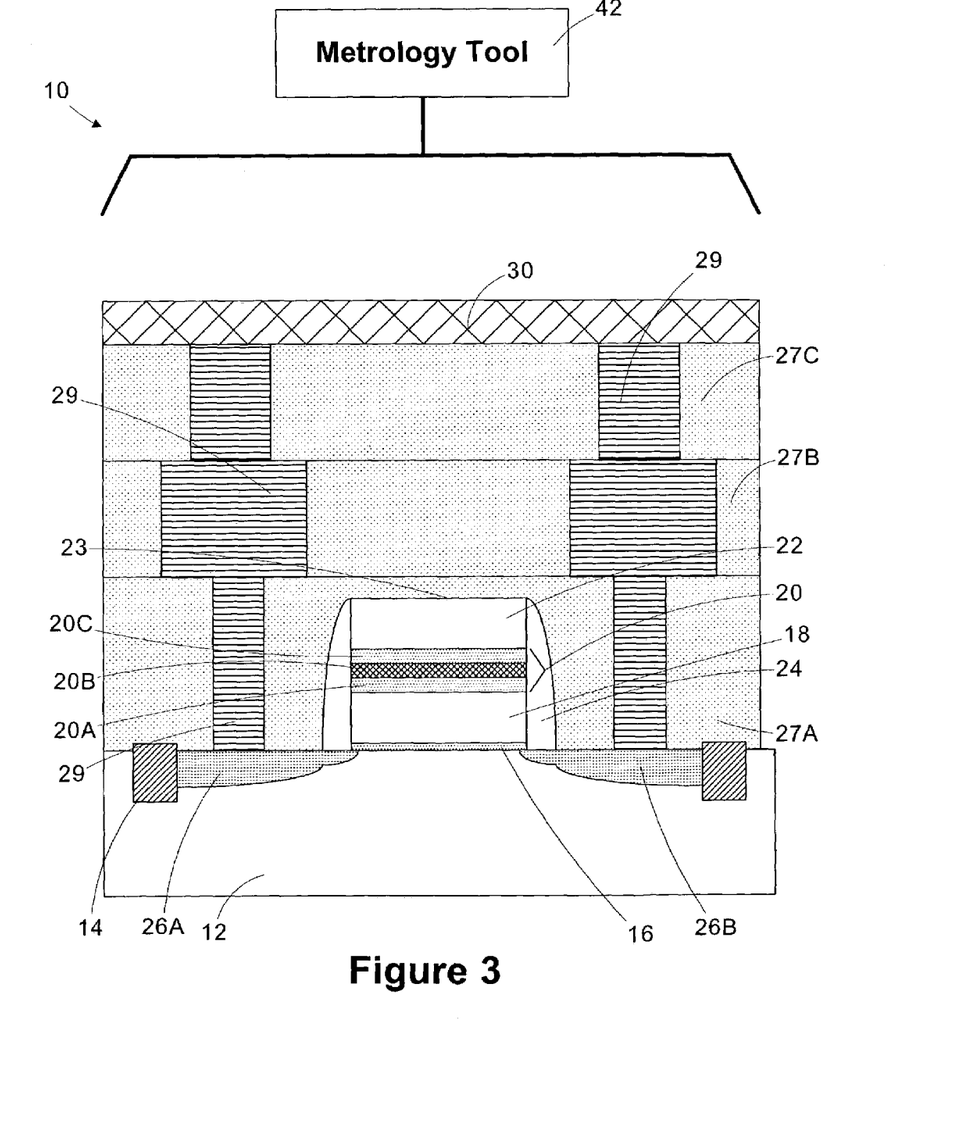
FIG. 3 is a schematic depiction of an illustrative metrology tool that may be used to obtain metrology data regarding one or more optical properties of a capping insulating layer on a memory device in accordance with one aspect of the present invention.
Figure 4:
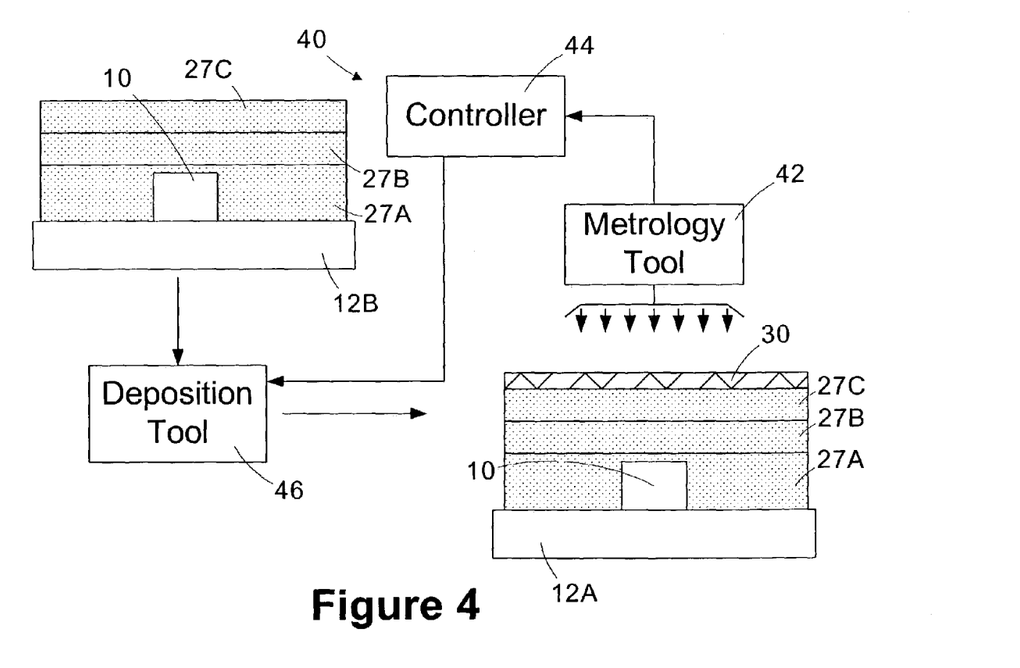
FIG. 4 is a schematic view of one illustrative embodiment of a system that may be used to practice one or more of the various inventive methods described herein.

FIGS. 3 and 4 are provided to further explain various aspects of the present invention. As depicted in FIG. 3, an illustrative metrology tool 42 is used to obtain data regarding one or more optical characteristics of the capping layer 30. Although only a single metrology tool 42 is depicted in FIG. 3, the present invention may be employed in situations where multiple metrology tools 42 may be used to measure one or more optical properties of the capping layer 30. The metrology tool 42 may be any type of metrology tool capable of providing metrology data regarding one or more optical properties of the capping layer 30. For example, the metrology tool 42 may be any ellipsometer or a reflectometer, etc.

FIG. 4 depicts an illustrative system 40 that may be used to employ the methods disclosed herein. As shown therein, the system 40 is generally comprised of the metrology tool 42, a controller 44 and a deposition tool 46. The deposition tool 46 will be used to form a capping layer 30 (single layer or film stack) on memory cells at the appropriate point during the process flow. For ease of reference, the memory cell 10 will be schematically depicted as a simple block in FIG. 4. The deposition tool 46 may be any type of tool or chamber that is capable of forming the capping layer 30, e.g., a CVD or PECVD tool or chamber. As used herein, the term deposition tool should be understood to cover a single tool with a single process chamber or one or more chambers of a multi-chamber tool.

Even more specifically, the system 40 is adapted to process substrates in a manner so as to optimize the optical characteristics of the capping layer 30 and to achieve better control of such optical properties as substrates are processed. As a result, the present invention may be used to produce memory devices with reduced UV erase times, to reduce the magnitude of variations in erase times on memory cells, and to obtain better control of UV erase times on memory cells.

As depicted in FIG. 4, initially, a capping layer 30 is formed over the memory cell 10 on the substrate 12A in the deposition tool 46. Thereafter, the substrate 12A is sent to the metrology tool 42 wherein one or more optical characteristics of the capping layer 30 on the substrate 12A is measured. In the case where the capping layer 30 is comprised of multiple layers, this may include measurement of each individual layer that comprises the capping layer 30 or it may involve obtaining optical characteristic data about the overall film stack after it is formed.

The optical characteristic metrology data is then provided to the controller 44. In turn, depending on the optical characteristic metrology data obtained by the metrology tool 42, the controller 44 may adjust one or more parameters of the deposition process used to form a capping layer 30 on a subsequently processed substrate 12B. Any of a variety of parameters of the deposition process may be controlled, e.g., gas composition and/or flow rates (to effect the stoichiometry of the layer), temperature, pressure, electrode spacing, etc. The deposition tool 46 then forms a capping layer 30 over the memory cell 10 formed on the substrate 12B using the process parameters determined by the controller 44 based on the measured optical characteristics of the capping layer 30 formed on the first substrate 12A.

The present methodology involves using measured optical characteristics of the capping layer 30 in a feedback control loop to control one or more parameters of the deposition process used to form the capping layer 30 on one or more subsequently processed substrates. Using this technique, the optical properties of the capping layer 30 may be driven toward, or maintained at or within, a desired value or desired range of values that will result in reduced, or at least more controlled, UV erase times for the memory cell 10. Additionally, the present invention may be employed to reduce the magnitude of variations in the optical characteristics of the capping layer 30 as substrates are being processed. Using the methodology disclosed herein, the optical properties of the capping layer 30 may be maintained at or near desirable values even if there are changes in one or more aspects of the process flow or equipment used to form the capping layer 30. For example, as the deposition tool 46 becomes dirty due to processing numerous substrates, it may tend to produce capping layers 30 that have different optical characteristics as compared to capping layers 30 produced when the deposition tool 46 was clean. The present invention may be useful in compensating for such variations as tool performance degrades.

The measurement of the optical properties of the capping layer 30 may be made as frequently as desired, e.g., every fourth wafer in every second lot, etc. The measured values may be averaged or statistically manipulated or combined if desired. Moreover, various control techniques may be employed to insure that any changes to the deposition process are gradual in nature and do not exhibit "jitter."

In the illustrated embodiment, the controller 44 is a computer programmed with software to implement the functions described herein. Moreover, the functions described for the controller 44 may be performed by one or more controllers spread throughout a semiconductor manufacturing facility. For example, the controller 44 may be a fab level controller that is used to control processing operations throughout all or a portion of a semiconductor manufacturing facility. Alternatively, the controller 44 may be a lower level computer that controls only portions or cells of the manufacturing facility. Moreover, the controller 44 may be a stand-alone device, or it may reside on the metrology tool 42 or the deposition tool 46. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 44, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is generally directed to various methods of controlling optical properties of a capping insulating layer on memory devices, and system for performing same. In one illustrative embodiment, the method comprises forming a first capping layer comprised of at least one process layer above a memory cell formed above a first semiconducting substrate, measuring at least one optical characteristic of the at least one process layer that comprises the first capping layer and determining at least one parameter of a deposition process to form at least one process layer of a second capping layer that is comprised of at least one process layer above a memory cell formed above a second semiconducting substrate based upon the measured optical characteristic of the first capping layer. In some cases, the first and second capping layers are each single layers of material. In other embodiments, the first and second capping layers are each comprised of a plurality of process layers.

In another illustrative embodiment, the method comprises performing a deposition process in a deposition tool to form a capping layer comprised of at least one process layer above a memory cell on a first substrate, measuring at least one optical characteristic of at least one of the layer(s) that comprise the capping layer formed above the first substrate, adjusting at least one parameter of the deposition process based upon the measured optical characteristic of the capping layer formed above the first substrate, and performing the deposition process comprised of the adjusted parameter in the deposition tool to form at least one process layer of a capping layer comprised of at least one process layer above a memory cell on a second substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

The invention claimed is:

1. A method, comprising:
   forming a first capping layer comprised of at least one process layer above a memory cell formed above a first semiconducting substrate;
   measuring at least one optical characteristic of said at least one process layer that comprises said first capping layer; and
   determining at least one parameter of a deposition process to form at least one process layer of a second capping layer that is comprised of at least one process layer above a memory cell formed above a second semiconducting substrate based upon said measured at least one optical characteristic of said at least one process layer of said first capping layer.

2. The method of claim 1, further comprising performing said deposition process comprised of said determined parameter to form said second capping layer.

3. The method of claim 1, wherein said first capping layer is a single layer of material.

4. The method of claim 1, wherein said first capping layer is comprised of a plurality of layers of material.

5. The method of claim 1, wherein forming said first capping layer comprises forming said first capping layer comprised of at least one of silicon nitride and silicon dioxide.

6. The method of claim 1, wherein said first capping layer is comprised of a first layer of silicon nitride, a second layer of silicon nitride, and a layer of spin-on glass positioned between said first and second layers of silicon nitride.

7. The method of claim 1, wherein said second capping layer is comprised of a first layer of silicon nitride, a second layer of silicon nitride, and a layer of spin-on glass positioned between said first and second layers of silicon nitride.

8. The method of claim 1, wherein measuring at least one optical characteristic comprises measuring at least one of an index of refraction ("n") and a coefficient of extinction ("k").

9. The method of claim 1, wherein determining at least one parameter of said deposition process comprises determining at least one of a gas composition, a gas flow rate, a temperature, a pressure and an electrode spacing of said deposition process.

10. The method of claim 1, wherein said deposition process is comprised of at least one of a chemical vapor deposition process and a plasma enhanced chemical vapor deposition process.

11. The method of claim 1, wherein said first and second substrates are within the same lots.

12. The method of claim 1, wherein said first and second substrates are in different lots.

13. The method of claim 1, wherein said memory cell is a flash memory cell.

14. The method of claim 1, wherein determining at least one parameter of a deposition process to form at least one process layer of a second capping layer that is comprised of at least one process layer above a memory cell formed above a second semiconducting substrate based upon said measured at least one optical characteristic of said at least one process layer of said first capping layer comprises determining at least one parameter of a deposition process to form at least one process layer of a second capping layer that is comprised of at least one process layer above a memory cell formed above a second semiconducting substrate based upon said measured at least one optical characteristic of said at least one process layer of said first capping layer such that the optical characteristics of said second capping layer are maintained within a desired range of values to reduce UV erase times for the memory cell on said second substrate.

15. A method, comprising:
    forming a first capping layer comprised of silicon nitride above a flash memory cell formed above a first semiconducting substrate;
    measuring at least one optical characteristic of said first capping layer; and
    determining at least one parameter of a deposition process to form a second capping layer comprised of silicon nitride above a flash memory cell formed above a second semiconducting substrate based upon said measured at least one optical characteristic of said first capping layer.

16. The method of claim 15, further comprising performing said deposition process comprised of said determined parameter to form said second capping layer.

17. The method of claim 15, wherein measuring at least one optical characteristic comprises measuring at least one of an index of refraction ("n") and a coefficient of extinction ("k").

18. The method of claim 15, wherein determining at least one parameter of said deposition process comprises determining at least one of a gas composition, a gas flow rate, a temperature, a pressure and an electrode spacing of said deposition process.

19. The method of claim 15, wherein said deposition process is comprised of at least one of a chemical vapor deposition process and a plasma enhanced chemical vapor deposition process.

20. The method of claim 15, wherein said first and second substrates are within the same lots.

21. The method of claim 15, wherein said first and second substrates are in different lots.

22. The method of claim 15, wherein determining at least one parameter of a deposition process to form a second capping layer comprised of silicon nitride above a flash memory cell formed above a second semiconducting substrate based upon said measured at least one optical characteristic of said first capping layer comprises determining at least one parameter of a deposition process to form a second capping layer comprised of silicon nitride above a flash memory cell formed above a second semiconducting substrate based upon said measured at least one optical characteristic of said first capping layer such that the optical characteristics of said second capping layer are maintained within a desired range of values to reduce UV erase times for the memory cell on said second substrate.

23. A method, comprising:
    forming a first capping layer comprised of a plurality of process layers above a flash memory cell formed above a first semiconducting substrate;
    measuring at least one optical characteristic of at least one of said plurality of process layers that comprise said first capping layer; and
    determining at least one parameter of a deposition process to form at least one process layer of a second capping layer that is comprised of a plurality of process layers above a flash memory cell formed above a second semiconducting substrate based upon said measured at least one optical characteristic.

24. The method of claim 23, further comprising performing said deposition process comprised of said determined parameter to form at least one of said plurality of process layers that comprise said second capping layer.

25. The method of claim 23, wherein measuring at least one optical characteristic comprises measuring at least one of an index of refraction ("n") and a coefficient of extinction ("k") of at least one of said plurality of process layers that comprise said first capping layer.

26. The method of claim 23, wherein measuring at least one optical characteristic comprises measuring at least one of an index of refraction ("n") and a coefficient of extinction ("k") of all of said process layers that comprise said first capping layer.

27. The method of claim 23, wherein determining at least one parameter of said deposition process comprises determining at least one of a gas composition, a gas flow rate, a temperature, a pressure and an electrode spacing of said deposition process.

28. The method of claim 23, wherein said deposition process is comprised of at least one of a chemical vapor deposition process and a plasma enhanced chemical vapor deposition process.

29. The method of claim 23, wherein said first and second substrates are within the same lots.

30. The method of claim 23, wherein said first and second substrates are in different lots.

31. The method of claim 23, wherein said first capping layer is comprised of a first layer of silicon nitride, a second layer of silicon nitride, and a layer of spin-on glass positioned between said first and second layers of silicon nitride.

32. The method of claim 23, wherein said second capping layer is comprised of a first layer of silicon nitride, a second layer of silicon nitride, and a layer of spin-on glass positioned between said first and second layers of silicon nitride.

33. The method of claim 23, wherein determining at least one parameter of a deposition process to form at least one process layer of a second capping layer that is comprised of a plurality of process layers above a flash memory cell formed above a second semiconducting substrate based upon said measured at least one optical characteristic comprises determining at least one parameter of a deposition process to form at least one process layer of a second capping layer that is comprised of a plurality of process layers above a flash memory cell formed above a second semiconducting substrate based upon said measured at least one optical characteristic such that the optical characteristics of said second capping layer are maintained within a desired range of values to reduce UV erase times for the flash memory cell on said second substrate.

34. A method, comprising:
    performing a deposition process in a deposition tool to form a capping layer comprised of at least one process layer above a memory cell on a first substrate;
    measuring at least one optical characteristic of said at least one process layer of said capping layer formed above said first substrate;
    adjusting at least one parameter of said deposition process based upon said measured at least one optical characteristic of said at least one process layer that comprises said capping layer formed above said first substrate; and
    performing said deposition process comprised of said adjusted parameter in said deposition tool to form at least one process layer of a capping layer comprised of at least one process layer above a memory cell on a second substrate.

35. The method of claim 34, wherein said capping layer formed above said first substrate is comprised of at least one of silicon nitride and silicon dioxide.

36. The method of claim 35, wherein said capping layer formed above said second substrate is comprised of at least one of silicon nitride and silicon dioxide.

37. The method of claim 34, wherein said capping layer formed above said first substrate is a single layer of material.

38. The method of claim 37, wherein said capping layer formed above said second substrate is a single layer of material.

39. The method of claim 34, wherein said capping layer formed above said first substrate is comprised of a plurality of process layers.

40. The method of claim 39, wherein said capping layer formed above said second substrate is comprised of a plurality of process layers.

41. The method of claim 34, wherein measuring at least one optical characteristic comprises measuring at least one of an index of refraction ("n") and a coefficient of extinction ("k").

42. The method of claim 34, wherein adjusting at least one parameter of said deposition process comprises adjusting at least one of a gas composition, a gas flow rate, a temperature, a pressure and an electrode spacing of said deposition process.

43. The method of claim 34, wherein said deposition process is comprised of at least one of a chemical vapor deposition process and a plasma enhanced chemical vapor deposition process.

44. The method of claim 34, wherein said first and second substrates are within the same lots.

45. The method of claim 34, wherein said first and second substrates are in different lots.

46. The method of claim 34, wherein said memory cell is a flash memory cell.

47. The method of claim 34, wherein said parameter of said deposition process is adjusted such that the optical characteristics of said capping layer formed above said memory cell on said second substrate are maintained within a desired range of values to reduce UV erase times for the memory cell on said second substrate.

48. A method, comprising:
    performing a deposition process in a deposition tool to form a capping layer comprised of silicon nitride above a flash memory cell on a first substrate;
    measuring at least one optical characteristic of said capping layer formed above said first substrate;
    adjusting at least one parameter of said deposition process based upon said measured at least one optical characteristic of said capping layer formed above said first substrate; and
    performing said deposition process comprised of said adjusted parameter in said deposition tool to form a capping layer comprised of silicon nitride above a flash memory cell on a second substrate.

49. The method of claim 48, wherein measuring at least one optical characteristic comprises measuring at least one of an index of refraction ("n") and a coefficient of extinction ("k").

50. The method of claim 48, wherein adjusting at least one parameter of said deposition process comprises adjusting at least one of a gas composition, a gas flow rate, a temperature, a pressure and an electrode spacing of said deposition process.

51. The method of claim 48, wherein said deposition process is comprised of at least one of a chemical vapor deposition process and a plasma enhanced chemical vapor deposition process.

52. The method of claim 48, wherein said first and second substrates are within the same lots.

53. The method of claim 48, wherein said first and second substrates are in different lots.

54. The method of claim 48, wherein said parameter of said deposition process is adjusted such that the optical characteristics of said second capping layer formed above said flash memory cell on said second substrate are maintained within a desired range of values to reduce UV erase times for the flash memory cell on said second substrate.

55. A method, comprising:
    performing a deposition process in a deposition tool to form a capping layer comprised of a plurality of process layers above a flash memory cell on a first substrate;
    measuring at least one optical characteristic of at least one of said process layers that comprise said capping layer formed above said first substrate;
    adjusting at least one parameter of said deposition process based upon said measured at least one optical characteristic of said at least one of said process layers that comprise said capping layer formed above said first substrate; and performing said deposition process comprised of said adjusted parameter in said deposition tool to form at least one process layer of a capping layer comprised of a plurality of process layers above a flash memory cell on a second substrate.

56. The method of claim 55, wherein measuring at least one optical characteristic comprises measuring at least one of an index of refraction ("n") and a coefficient of extinction ("k").

57. The method of claim 55, wherein adjusting at least one parameter of said deposition process comprises adjusting at least one of a gas composition, a gas flow rate, a temperature, a pressure and an electrode spacing of said deposition process.

58. The method of claim 55, wherein said deposition process is comprised of at least one of a chemical vapor deposition process and a plasma enhanced chemical vapor deposition process.

59. The method of claim 55, wherein said first and second substrates are within the same lots.

60. The method of claim 55, wherein said first and second substrates are in different lots.

61. The method of claim 55, wherein said first capping layer is comprised of a first layer of silicon nitride, a second layer of silicon nitride, and a layer of spin-on glass positioned between said first and second layers of silicon nitride.

62. The method of claim 61, wherein said second capping layer is comprised of a first layer of silicon nitride, a second layer of silicon nitride, and a layer of spin-on glass positioned between said first and second layers of silicon nitride.

63. The method of claim 55, wherein said parameter of said deposition process is adjusted such that the optical characteristics of said second capping layer formed above said flash memory cell on said second substrate are maintained within a desired range of values to reduce UV erase times for the flash memory cell on said second substrate.

64. A method, comprising:

forming a first capping layer comprised of at least one process layer above an integrated circuit device formed above a first semiconducting substrate;

measuring at least one optical characteristic of said at least one process layer that comprises said first capping layer; and determining at least one parameter of a deposition process to form at least one process layer of a second capping layer that is comprised of at least one process layer above an integrated circuit device formed above a second semiconducting substrate based upon said measured at least one optical characteristic of said at least one process layer of said first capping layer.

65. The method of claim 64, further comprising performing said deposition process comprised of said determined parameter to form said second capping layer.

66. The method of claim 64, wherein said first capping layer is a single layer of material.

67. The method of claim 64, wherein said first capping layer is comprised of a plurality of layers of material.

68. The method of claim 64, wherein forming said first capping layer comprises forming said first capping layer comprised of at least one of silicon nitride and silicon dioxide.

69. The method of claim 64, wherein said first capping layer is comprised of a first layer of silicon nitride, a second layer of silicon nitride, and a layer of spin-on glass positioned between said first and second layers of silicon nitride.

70. The method of claim 64, wherein said second capping layer is comprised of a first layer of silicon nitride, a second layer of silicon nitride, and a layer of spin-on glass positioned between said first and second layers of silicon nitride.

71. The method of claim 64, wherein measuring at least one optical characteristic comprises measuring at least one of an index of refraction ("n") and a coefficient of extinction ("k").

72. The method of claim 64, wherein determining at least one parameter of said deposition process comprises determining at least one of a gas composition, a gas flow rate, a temperature, a pressure and an electrode spacing of said deposition process.

73. The method of claim 64, wherein said deposition process is comprised of at least one of a chemical vapor deposition process and a plasma enhanced chemical vapor deposition process.

74. The method of claim 64, wherein said first and second substrates are within the same lots.

75. The method of claim 64, wherein said first and second substrates are in different lots.

76. The method of claim 64, wherein said integrated circuit device comprises a floating gate.

77. The method of claim 64, wherein said integrated circuit device comprises a memory cell and logic circuitry.

\* \* \* \* \*